United States Patent
Huang et al.

(10) Patent No.: US 8,507,350 B2
(45) Date of Patent: Aug. 13, 2013

(54) FABRICATING METHOD OF SEMICONDUCTOR ELEMENTS

(75) Inventors: Chien-Chung Huang, Taichung (TW); Nien-Ting Ho, Tainan (TW)

(73) Assignee: United Microelectronics Corporation, Hsinchu (TW)

( * ) Notice: Subject to any disclaimer, the term of this patent is extended or adjusted under 35 U.S.C. 154(b) by 153 days.

(21) Appl. No.: 13/238,045

(22) Filed: Sep. 21, 2011

(65) Prior Publication Data
US 2013/0071981 A1    Mar. 21, 2013

(51) Int. Cl.
*H01L 21/336* (2006.01)

(52) U.S. Cl.
USPC .......................... 438/301; 438/300

(58) Field of Classification Search
USPC .......... 257/190, 288, 316, 368, 410, 412, 257/766, 768; 438/161, 197, 301–308, 365, 438/627
See application file for complete search history.

(56) References Cited

U.S. PATENT DOCUMENTS

| | | | |
|---|---|---|---|
| 5,998,873 A | 12/1999 | Blair | |
| 6,156,654 A | 12/2000 | Ho et al. | |
| 6,291,278 B1 * | 9/2001 | Xiang et al. | 438/197 |
| 6,855,607 B2 | 2/2005 | Achuthan | |
| 7,013,446 B2 | 3/2006 | Ohba | |
| 7,105,429 B2 | 9/2006 | Jawarani | |
| 7,112,495 B2 | 9/2006 | Ko | |
| 7,214,620 B2 | 5/2007 | Kim | |
| 7,250,658 B2 | 7/2007 | Doris | |
| 7,521,324 B2 | 4/2009 | Ohmi | |
| 7,531,437 B2 | 5/2009 | Brask | |
| 7,592,270 B2 | 9/2009 | Teo | |
| 7,666,762 B2 | 2/2010 | Jeon et al. | |
| 7,700,448 B2 | 4/2010 | Futase et al. | |
| 7,795,124 B2 | 9/2010 | Nouri et al. | |
| 7,821,138 B2 | 10/2010 | Yamada et al. | |
| 7,960,838 B2 | 6/2011 | Hsu et al. | |
| 2004/0137687 A1 * | 7/2004 | Feudel et al. | 438/302 |
| 2006/0131662 A1 | 6/2006 | Yamada et al. | |
| 2007/0015365 A1 | 1/2007 | Chen | |
| 2007/0072376 A1 | 3/2007 | Chen | |
| 2007/0141798 A1 * | 6/2007 | Bohr | 438/301 |
| 2007/0202692 A1 | 8/2007 | Watanabe et al. | |
| 2007/0218661 A1 | 9/2007 | Shroff | |
| 2008/0061366 A1 | 3/2008 | Liu | |
| 2008/0090369 A1 | 4/2008 | Akiyama et al. | |
| 2008/0157208 A1 | 7/2008 | Fischer et al. | |
| 2008/0242059 A1 | 10/2008 | McSwiney et al. | |
| 2008/0299720 A1 | 12/2008 | Carruthers et al. | |

(Continued)

OTHER PUBLICATIONS

U.S. Appl. No. 12/944,738, date: Nov. 12, 2010.

*Primary Examiner* — Kimberly Rizkallah
*Assistant Examiner* — Errol Fernandes
(74) *Attorney, Agent, or Firm* — WPAT, PC; Justin King

(57) ABSTRACT

A fabricating method of a semiconductor element includes the following steps. First, a substrate is provided. A metal gate structure and source/drain electrodes are already formed on the substrate. An amorphization process is performed in the source/drain electrodes to form an amorphous portion. An interlayer dielectric layer is formed on surfaces of the source/drain electrodes and a through hole contact is formed within the interlayer dielectric layer. A silicidation process is performed with the through hole contact and the amorphous portion of the source/drain electrodes to form a metal silicide layer. The fabricating method is capable of finishing the formation of the metal silicide layer in the condition that diameters of the through hole contact is becoming smaller and smaller.

11 Claims, 3 Drawing Sheets

(56) References Cited

U.S. PATENT DOCUMENTS

| | | |
|---|---|---|
| 2009/0050972 A1* | 2/2009 | Lindsay et al. ............... 257/368 |
| 2009/0057759 A1 | 3/2009 | Obradovic |
| 2009/0124097 A1 | 5/2009 | Cheng |
| 2009/0184374 A1 | 7/2009 | Clevenger et al. |
| 2009/0191684 A1 | 7/2009 | Shue et al. |
| 2009/0200494 A1 | 8/2009 | Hatem |
| 2010/0040768 A1 | 2/2010 | Dhindsa |
| 2010/0044783 A1 | 2/2010 | Chuang |
| 2010/0048027 A1 | 2/2010 | Cheng |
| 2010/0109046 A1* | 5/2010 | Mehandru et al. ............ 257/190 |
| 2010/0129994 A1 | 5/2010 | Awad |
| 2011/0024840 A1* | 2/2011 | Khater .......................... 257/347 |

* cited by examiner

US 8,507,350 B2

FABRICATING METHOD OF SEMICONDUCTOR ELEMENTS

FIELD OF THE INVENTION

The present invention relates to a fabricating method of semiconductor elements, and more particularly, to a fabricating method of semiconductor elements for integrated circuits.

BACKGROUND OF THE INVENTION

Metal oxide semiconductors are very common circuit elements in integrated circuits (ICs). As the semiconductor fabricating processes reach into a sub-micro level, high-k gate dielectrics/metal gates become important elements in metal oxide semiconductors. Usually, the high-k gate dielectric and the metal gate are formed after finishing a self-aligned silicidation process for forming metal silicide layers on source/drain electrodes. However, metal silicide layers formed by the self-aligned silicidation process usually can't endure high temperature, and thus easily be damaged by the high temperature environment in the process for forming the high k gate dielectric. To overcome this disadvantage, through contact self-aligned silicidation process is developed.

In short, through contacts above the source/drain electrodes are firstly formed, and then self-aligned silicidation process is performed using the exposed through contacts as self-aligned mask and the reactants for producing the metal silicide layer can be intruded onto the source/drain electrodes from the through contacts. This process is the so-called through contact self-aligned silicidation process. However, as the size of semiconductors are becoming smaller and smaller, a diameter of the through contacts also becomes smaller and smaller. As a result, the silicidation process is very difficult to implement in the through contacts. Accordingly, the performance of metal oxide semiconductors is difficult to improve. Therefore, there is a desire to overcome the aforementioned disadvantages.

SUMMARY OF THE INVENTION

A fabricating method of a semiconductor element includes the following steps. First, a substrate is provided. A metal gate structure and source/drain electrodes are already formed on the substrate. An amorphization process is performed in the source/drain electrodes to form an amorphous portion. An interlayer dielectric layer is formed on surfaces of the source/drain electrodes and a through hole contact is formed within the interlayer dielectric layer. A silicidation process is performed with the through hole contact and the amorphous portion of the source/drain electrodes to form a metal silicide layer.

In the above fabricating method, the amorphization process only needs the amorphization process and the following thermal process to finish the formation of metal silicide layers. The fabricating method is capable of finishing the formation of the metal silicide layer in the condition that diameters of the through hole contact is becoming smaller and smaller.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
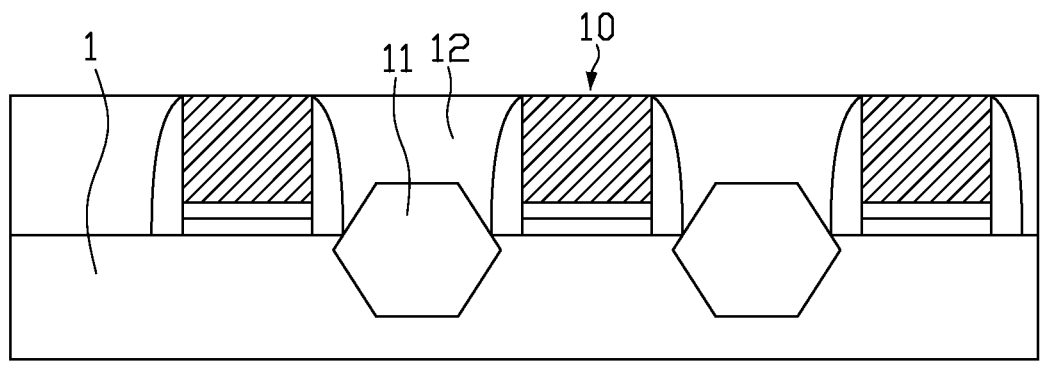
FIGS. 1A to 1G are schematic views illustrating a fabricating method of a semiconductor element according to an embodiment of the present invention.

FIGS. 1A to 1G are schematic views illustrating a fabricating method of a semiconductor element according to the embodiments of the present invention. Firstly, as shown in FIG. 1A, a substrate 1 is provided, on which a metal gate structure 10, a source/drain electrodes 11, and an interlayer dielectric (ILD) layer 12 are already formed. The substrate 1, for example, is a silicon substrate, and the metal gate structure 10 comprises multiple layers including a metal gate and a high-k gate dielectric, but the present embodiment is not limited to this example. It is to be noted that any suitable metal gate structure can be employed in this embodiment. The source/drain electrodes 11, for example, are embedded source/drain structures formed by an epitaxy growing manner, but the present embodiment is not limited to this example. The source/drain electrodes 11 consists of a material selected from a group consisting of silicon, germanium silicide, and silicon carbide.

Figure 1B:
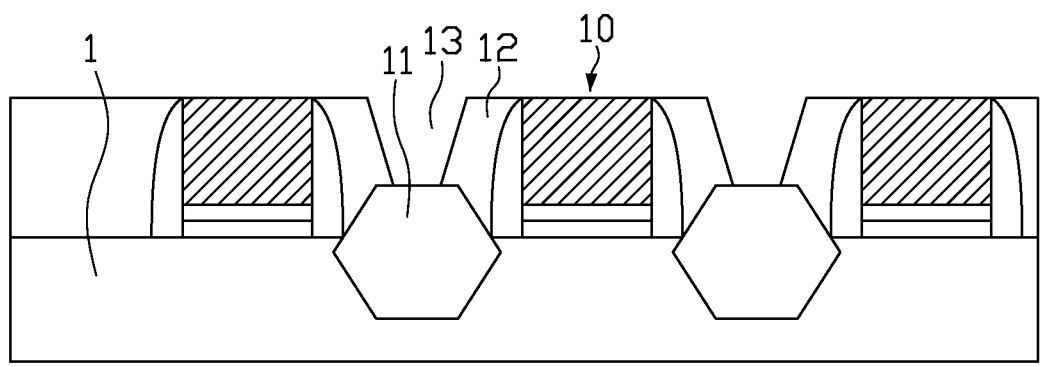
Figure 1C:
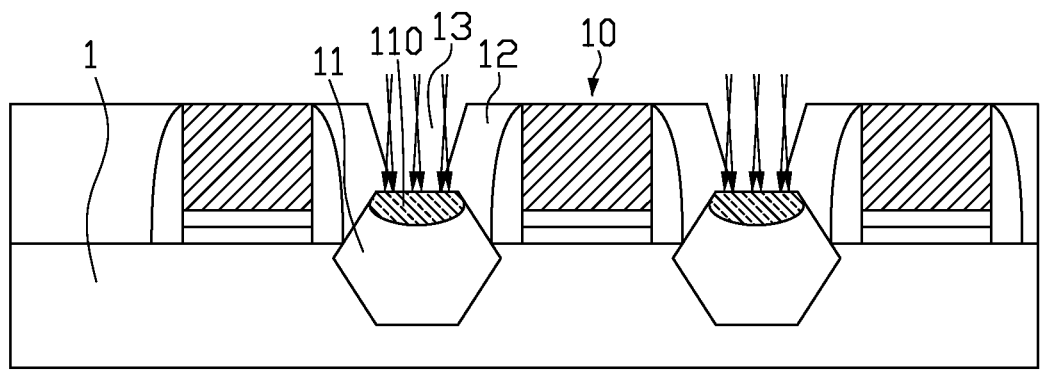

Referring to FIG. 1B, through contacts 13 are formed in a portion of the ILD layer 12 that is directly above the source/drain electrodes 11 using an etching process. As the size of semiconductors is required to be smaller and smaller, a diameter of the through contacts 13 should also be smaller and smaller. As a result, the silicidation process is very difficult to implement in the through contacts. As shown FIG. 1C, in the present embodiment, an amorphization process is performed in a portion of the source/drain electrodes 11 that are exposed from the through contacts 12 after the through contacts 13 are formed to render the portion of the source/drain electrodes 11 to become an amorphous portion 110. The amorphization process, for example, is a pre-amorphization implant (PAI), which mainly utilizes tetravalent ions (such as germanium or silicon ions), inert particles (e.g., argon particles), or large N-type particles (e.g., arsenic atoms) to bombard and destroy the crystalline structure in the portion of the source/drain electrodes 11. However, this amorphization implant doesn't change a conductivity type of the source/drain electrodes 11. Besides, an implantation depth of the PAI process can be controlled in in a region of the metal silicide to avoid side effects of the PAI process. In addition, the amorphization implant may be implanted at an inclining angle, thus, the resulted amorphous portion 110 may be larger than the exposed portion of the source/drain electrodes 11. In other words, the amorphous portion 110 is partially covered by the ILD layer 12, and this configuration helps the growth of the metal silicide in lateral directions.

Figure 1D:
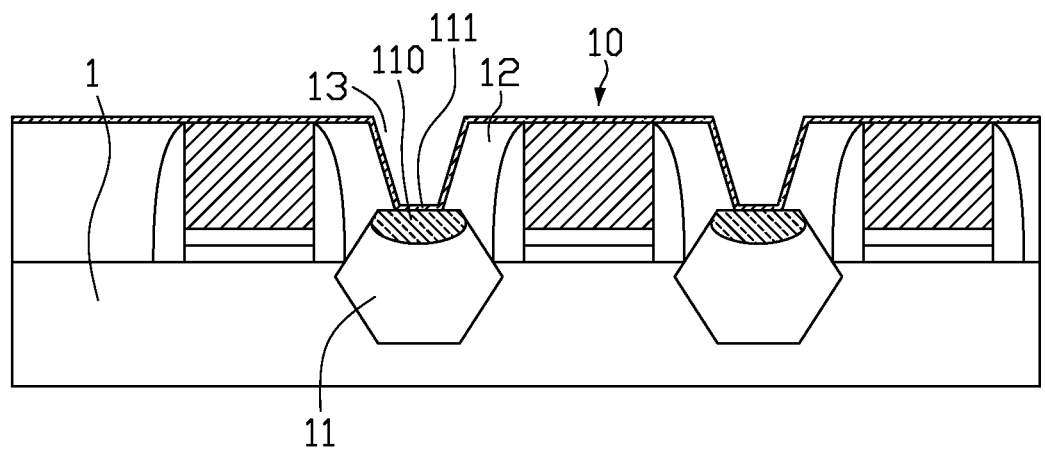
Figure 1E:
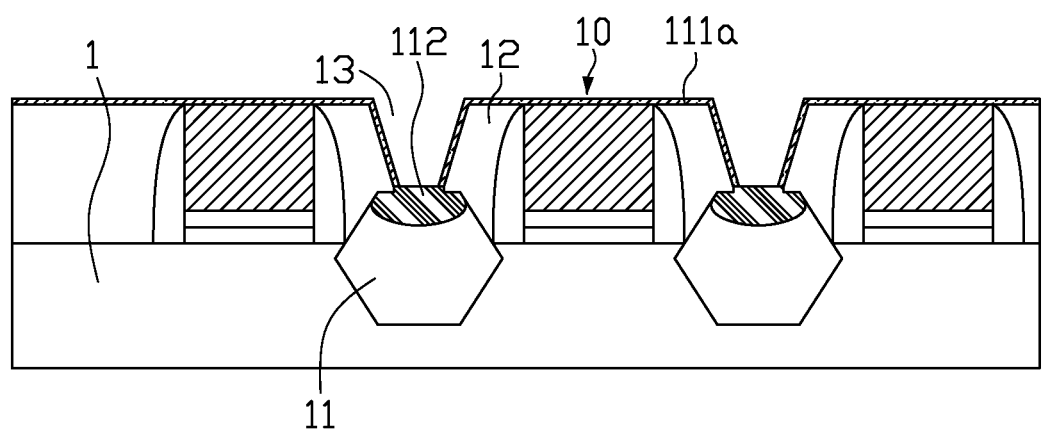
Figure 1F:
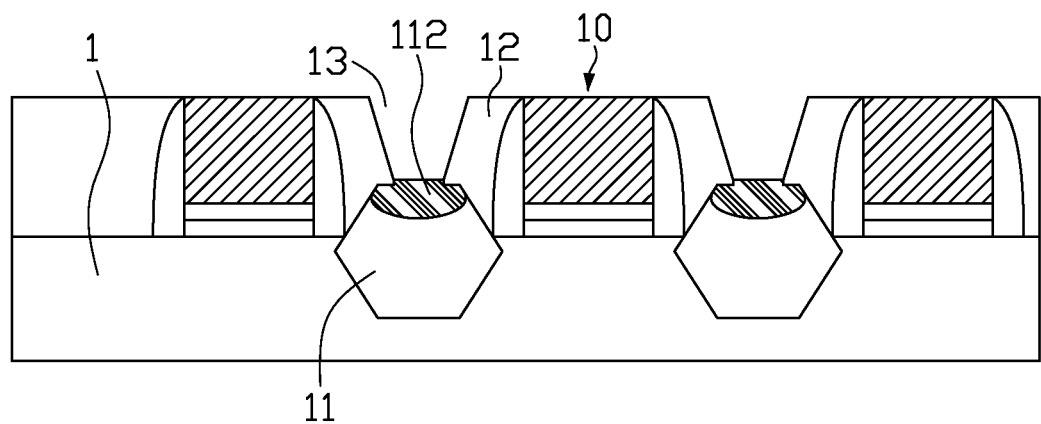
Figure 1G:
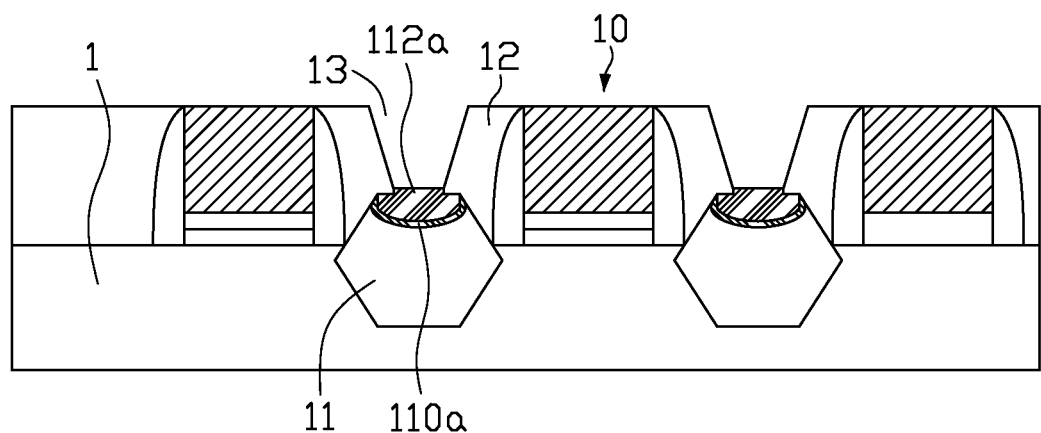

As shown in FIG. 1F, in sequence, a silicidation process is performed on the exposed amorphous portion 110 from the through contacts 13 to form a metal silicide layer 112. The metal silicide layer 112, for example, consists of a material selected from a group consisting of, nickel silicide, cobalt silicide, and titanium silicide. The silicidation process, for example, includes the following steps. First, as shown in FIG. 1D, a physical vapor deposition (PVD), a chemical vapor deposition (CVD), or an electroless metal deposition (EMD)

is performed on exposed surfaces of the amorphous portion 110, sidewalls of the through contacts 13 to deposit a metal layer 111 such as nickel, cobalt, or titanium. After that, as shown in FIG. 1E, a thermal process, for example, a rapid thermal process (RTP) or a laser-spike annealing (LSA) is performed to react a portion of the metal layer 111 that is directly on the amorphous portion 110 with the amorphous portion 110. As a result, the meal silicide layer 112 is obtained. Finally, as shown in FIG. 1F, a remained metal layer 111a that doesn't react with the amorphous portion 110 is removed, for example, peeled, from surfaces of the through contacts 13, the ILD layer 12, or the metal gate structure 10 to finish the self-aligned silicidation process. In the example shown in FIGS. 1D-1F, the amorphous portion 110 completely react with the metal layer 111, that is, there is no amorphous portion remaining in the element. However, in another embodiment, as shown in FIG. 1G, a bottom of the amorphous portion 110 remains after the self-aligned silicidation process. That is, an amorphous thin layer 110a is at the bottom of a metal silicide layer 112a.

Besides, the above amorphization process to the source/drain electrodes 11 can also be performed at other time points, for example, prior to forming the ILD layer 12 and the amorphous portion 110 can also be obtained from this modified process. In another embodiment, the PAI process is performed both prior to the ILD layer 12 is formed and after the through contacts 13 are formed. All the above described manners can overcome the shortages of the know process.

In the present embodiment, the amorphization process only needs the PAI process and the following thermal process to finish the formation of metal silicide layers. The fabricating method is capable of finishing the formation of the metal silicide layer in the condition that diameters of the through hole contact is becoming smaller and smaller.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A fabricating method of a semiconductor element, comprising:
    providing a substrate, wherein a metal gate structure and source/drain electrodes are formed on the substrate;
    performing an amorphization process in the source/drain electrodes to form an amorphous portion therein;
    forming an interlayer dielectric layer covering the source/drain electrodes and forming a through hole contact in the interlayer dielectric layer; and
    performing a silicidation process with the amorphous portion of the source/drain electrodes and the through hole contact to form a metal silicide layer on a surface of the source/drain electrodes;
    wherein the amorphization process is performed both prior to the interlayer dielectric is formed and after the through hole contact is formed.

2. The fabricating method of a semiconductor element of claim 1, wherein the substrate is a silicon substrate, the metal gate structure comprises a metal gate and a high-k dielectric layer.

3. The fabricating method of a semiconductor element of claim 1, wherein the source/drain electrodes are embedded electrodes formed by epitaxy growing of a material selected from a group consisting of silicon, germanium silicide, and silicon carbide.

4. The fabricating method of a semiconductor element of claim 1, wherein the amorphization process is a pre-amorphization implant which utilizes particles to destroy the crystalline structure of the source/drain electrodes.

5. The fabricating method of a semiconductor element of claim 4, wherein the particles comprises germanium or arsenic.

6. The fabricating method of a semiconductor element of claim 4, wherein the pre-amorphization implant is performed at an angle to a top surface of the source/drain electrodes.

7. The fabricating method of a semiconductor element of claim 1, wherein the silicidation process comprises:
    depositing a metal layer, and
    performing a heat process to react the metal layer with the amorphous portion to form the metal silicide layer.

8. The fabricating method of a semiconductor element of claim 7, wherein the metal layer consists of a metal selected from a group consisting of nickel, cobalt and titanium, and the metal silicide layer is nickel silicide (NiSi), cobalt silicide (CoSi), or titanium silicide (TiSi).

9. The fabricating method of a semiconductor element of claim 7, wherein the heat process is a rapid thermal process or a laser-spike annealing process.

10. The fabricating method of a semiconductor element of claim 7, further comprising removing a remaining metal layer.

11. The fabricating method of a semiconductor element of claim 7, wherein the metal layer is deposited by a physical vapor deposition process, a chemical vapor deposition process, or an electroless metal deposition process.

* * * * *